United States Patent [19]
Watts et al.

[11] Patent Number: 6,071,816
[45] Date of Patent: *Jun. 6, 2000

[54] METHOD OF CHEMICAL MECHANICAL PLANARIZATION USING A WATER RINSE TO PREVENT PARTICLE CONTAMINATION

[75] Inventors: David K. Watts, Austin, Tex.; Rajeev Bajaj, Fremont, Calif.; Sanjit K. Das, Austin, Tex.

[73] Assignee: Motorola, Inc., Schaumburg, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 08/921,131

[22] Filed: Aug. 29, 1997

[51] Int. Cl.$^7$ .................................................. H01L 21/302
[52] U.S. Cl. .......................................... 438/692; 438/693
[58] Field of Search .................................. 438/689, 690, 438/691, 692, 693

[56] References Cited

U.S. PATENT DOCUMENTS

| | | | |
|---|---|---|---|
| 5,225,034 | 7/1993 | Yu et al. | 156/636 |
| 5,531,861 | 7/1996 | Yu et al. | 156/636.1 |
| 5,551,986 | 9/1996 | Jain | 134/6 |
| 5,578,529 | 11/1996 | Mullins | 437/228 |
| 5,773,360 | 6/1998 | Chang et al. | 438/692 |
| 5,792,709 | 12/1995 | Robinson et al. | 438/692 |
| 5,804,507 | 9/1998 | Perlov et al. | 438/692 |
| 5,821,160 | 10/1998 | Rodriquez et al. | 438/601 |

OTHER PUBLICATIONS

Aoki, et al., "Novel Electrolysis–Ionized Water Cleaning Technique for the Chemical–Mechanical Polishing (CMP) Process, "1994 Symposium on VLSI Technology Digest of Technical Pages, IEEE, pp. 79–80 (1994).

Kaufman, et al., "Chemical–Mechanical Polishing for Fabrication Patterened W Metal Features as Chip Interconnects, "J. Electrochem Soc., pp. 3460–3464 (1991)

*Primary Examiner*—Benjamin L. Utech
*Assistant Examiner*—Kin-Chan Chen

[57] ABSTRACT

A method of chemical mechanical planarization of a semiconductor device provides a semiconductor device having a device front surface and a device back surface with the device front surface being a top surface of a second metal layer. A first planarizing step planarizes the device front surface with a first medium to expose a device second front surface, where the first medium comprises a first abrasive component and a first chemical solution. A rinsing step then rinses the device back surface with water. A second planarizing step then planarizes the device second front surface with a second medium where the second medium comprises a second abrasive component and a second chemical solution.

27 Claims, 4 Drawing Sheets

METHOD OF CHEMICAL MECHANICAL PLANARIZATION USING A WATER RINSE TO PREVENT PARTICLE CONTAMINATION

FIELD OF THE INVENTION

The present invention relates generally to chemical mechanical planarization (CMP) of semiconductor devices and, more particularly, to a method of CMP that includes a water rinse to prevent particle contamination during CMP.

BACKGROUND OF THE INVENTION

CMP is a well known process in the semiconductor industry used to remove and planarize layers of material deposited on a semiconductor device to achieve a planar topography on the surface of the semiconductor device. To remove and planarize the layers of deposited material, CMP typically involves wetting a pad with a chemical slurry containing abrasive components and mechanically "rubbing" or "buffing" the front surface of a semiconductor device against the wet pad to remove the layers of deposited materials on the front surface of the semiconductor device and planarize the surface. The types of deposited materials removed and planarized may include metal layers as well as dielectric layers that form the front surface of the semiconductor device.

Typically, the CMP of a metal layer consists of two primary steps—a first step removes the metal layer on the front surface of the semiconductor device and planarizes the remaining surface; while a second "touch up" or "buff" step removes any contaminants remaining after the first step and re-planarizes the front surface. Each step requires the use of a chemical slurry as described above to remove the metal layer in the case of the first step and any remaining contaminants in the touch-up step. The chemical slurry used in each step may be composed of identical or different compositions depending on the CMP requirements.

Conventional CMP of metal layers also involves an intermediate rinsing step between the two primary steps described above. The intermediate rinsing step consists of repositioning the semiconductor device at a rinse station and spraying water at the front surface of the semiconductor device to remove the slurry from the first step prior to subjecting the device to the second slurry in the second step. It has been discovered by the Applicants that some of the chemical slurry from the first step remains "trapped" on the back surface of the semiconductor device that is not rinsed in the intermediate rinsing step since the water sprayed during this step only sprays the front surface and cannot reach the back surface of the semiconductor device.

A problem exists when the slurry used in the first step is not completely removed, prior to the second step, and mixes with the slurry used in the second step. Often, this mixing of the two slurries will cause a chemical reaction that results in particle generation that contaminates the semiconductor device and causes a severe effect on the yield and performance of such devices. A need therefore exists to remove the "trapped" slurry, on the back surface of the semiconductor device, to prevent particle generation caused by the mixing of the slurries after the primary steps. Any solution to this problem must significantly reduce particles and overall device defectivity, be performed at a low cost with few and simple additional process steps and be preferably ecologically safe with insignificant environmental impact.

BRIEF DESCRIPTION OF THE DRAWINGS

A better understanding of the present invention can be obtained when the following detailed description of a preferred embodiment is considered in conjunction with the following drawings, in which.

DETAILED DESCRIPTION OF A PREFERRED EMBODIMENT

Figure 5:
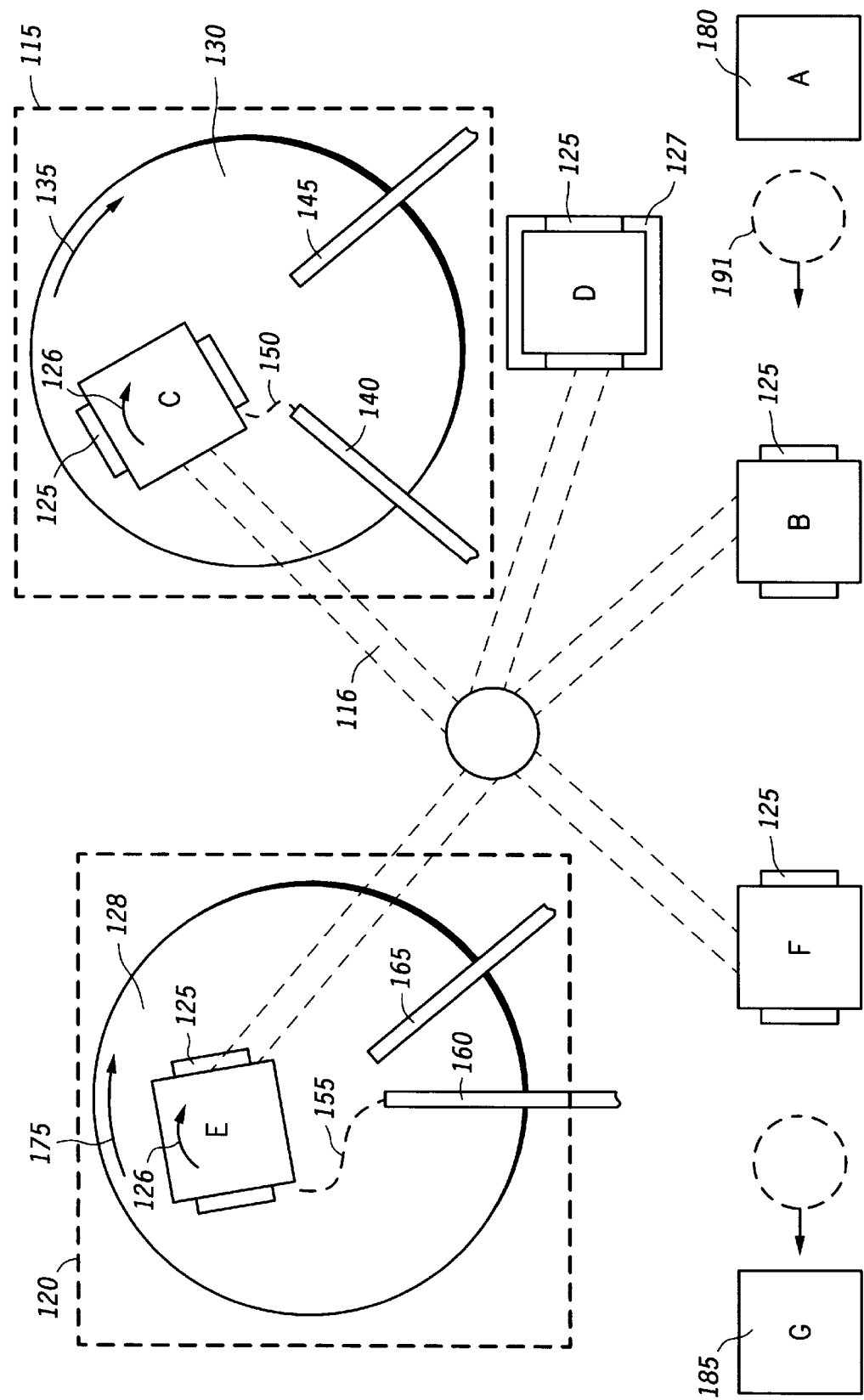
FIG. 5 is a top view of an embodiment implementing the CMP method of the present invention.
Figure 6:
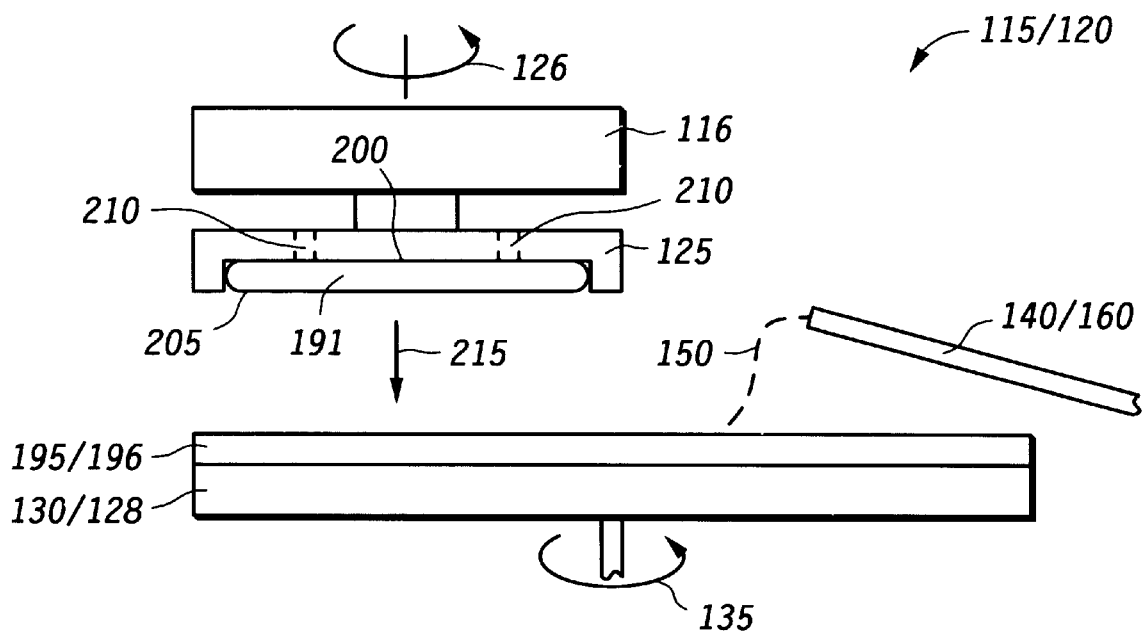
FIG. 6 is a side view of an embodiment implementing the CMP method of the present invention.
Figure 7:
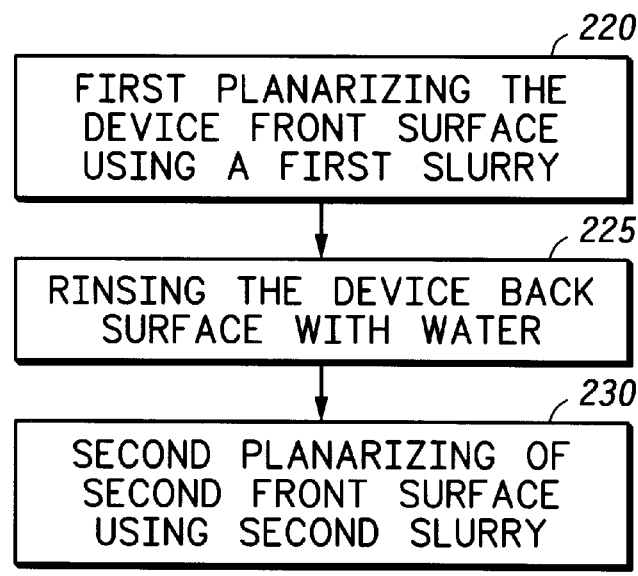
FIG. 7 is a flow diagram of the CMP method of the present invention implemented by the embodiment disclosed.
Figure 8:
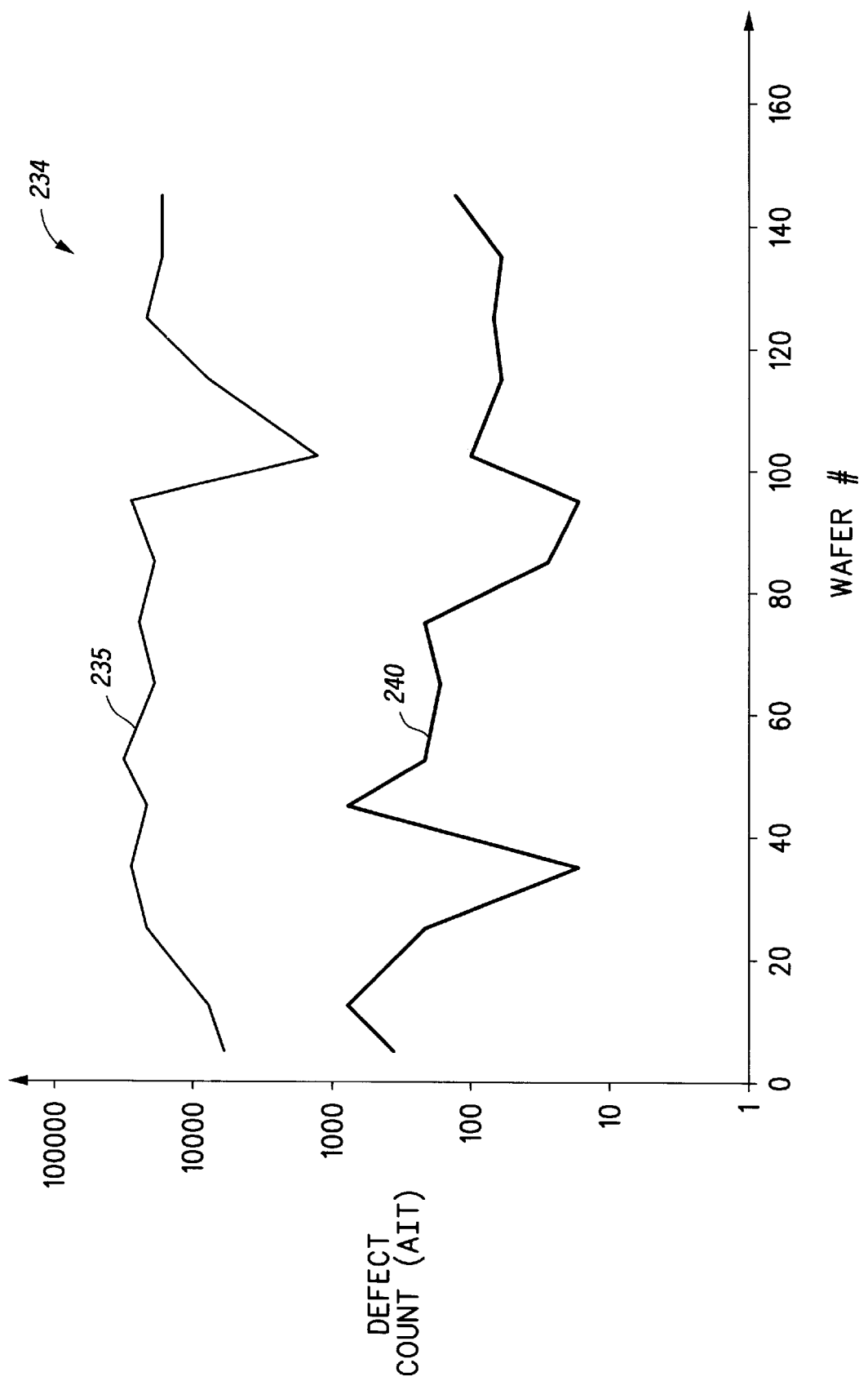
FIG. 8 is a graph illustrating the effect of using the CMP method of the present invention to lower particle contaminants on a semiconductor device.

FIGS. 1–4 illustrate the effect of the CMP method of the present invention on a semiconductor device by providing cross-sectional views of the semiconductor device before applying the CMP method and after application of such method. While some references to the actual CMP method of the present invention are made while describing the effect of the CMP method in FIGS. 1–4, the actual CMP method used is detailed in the description relating to FIGS. 5–7 depicting an embodiment using the CMP method of the present invention and a flow diagram of said method. FIG. 8 then illustrates the effect of using the CMP method that lowers particle contaminants.

Figure 1:
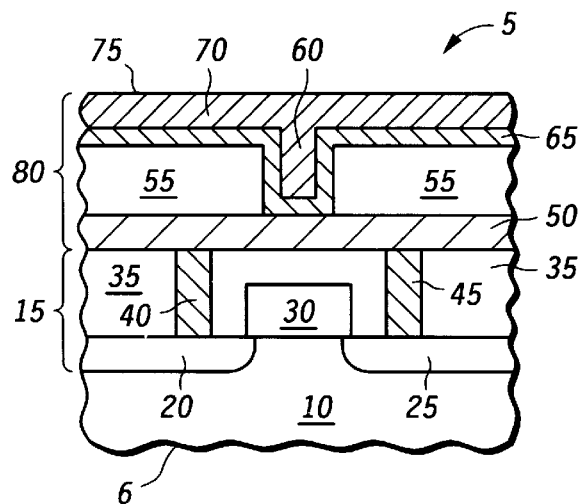
FIG. 1 is a cross-sectional view of a semiconductor device to be planarized using the CMP method of the present invention.

FIG. 1 is a cross-sectional view of a semiconductor device 5 prior to undergoing the CMP method of the present invention. The semiconductor device 5 is exemplary of one of many such devices that are typically found on a semiconductor wafer (not shown) that will undergo the CMP method of the present invention. The semiconductor device 5 has a semiconductor structure beginning with a silicon substrate 10. The bottom surface of the silicon substrate 10 is the device back surface 6 of the semiconductor device 5. Overlying the silicon substrate 10 is an active device 15, including a source region 20, a drain region 25, a gate region 30 and active device dielectric 35 insulating the various regions. A source metal contact 40 and a drain metal contact 45 provide the voltage source to activate the semiconductor device 5. Immediately above the active device dielectric 35 and source 40 and drain 45 contacts is a first metal layer 50. This first metal layer 50 may typically be tungsten, however, various other well known metals and metal alloys may also be substituted therefor, including copper, aluminum, platinum, iridium and alloys thereof.

A dielectric layer 55 overlies the first metal layer 50 to provide insulation for a via 60 formed in the dielectric layer 55. Typical dielectrics used to form the dielectric layer 55 includes silicon dioxide, fluorine doped silicon dioxide, polymides, polyethylenes and other organic polymer materials. A barrier/glue layer 65 is then formed over the dielectric layer 55 to adhere the dielectric layer 55 to subsequent layers, to prevent diffusion of metal (e.g. copper) and/or mobile impurities and/or to prevent electromigration. The barrier/glue layer 65 is typically titanium nitride, however titanium, titanium silicon nitride, tantalum nitride, tantalum silicon nitride and other tantalum based alloys may also be used. Overlying the barrier/glue layer 65 is a second metal layer 70, typically tungsten, but as with the first metal layer 50, may be various other well known metals and metal alloys substituted therefor. The second metal layer 70 fills the via 60 in addition to overlying the barrier/glue layer 65. The top surface of the second metal layer 70 becomes the device front surface 75 of the semiconductor device 5 that will be planarized using the CMP method of the present invention. It is understood, however, that the any metal layer, including the first metal layer 50, may be planarized using the CMP method of the present invention.

Figure 2:
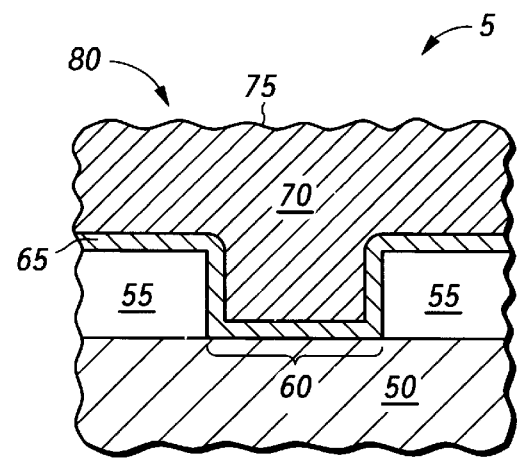
FIG. 2 is an exploded cross-sectional view of a portion of the semiconductor device depicted in FIG. 1 that is to be planarized using the CMP method of the present invention.

FIG. 2 illustrates an exploded cross-sectional view of the semiconductor device portion 80 depicted in FIG. 1 that is to be planarized using the CMP method of the present invention. From the exploded view of FIG. 2, the uneven topography of the device front surface 75 is shown. This semiconductor device portion 80 is effectively the semiconductor device 5 that is to be planarized using the method of the present invention since only the device front surface 75 will be planarized. Accordingly, the semiconductor device portion 80 is hereinafter referred to generally as the semiconductor device 5.

Figure 3:
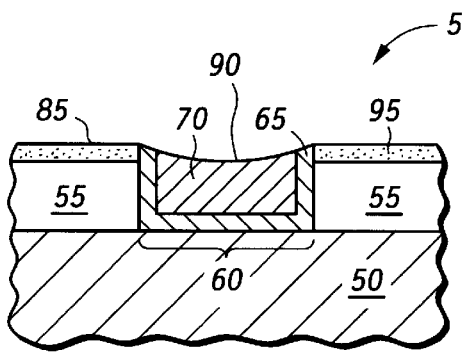
FIG. 3 is a cross-sectional view of the semiconductor device after a first planarizing step of the CMP method of the present invention.

FIG. 3 illustrates the semiconductor device 5 after first planarizing the device front surface 75 (shown in FIG. 2) to remove the second metal layer 70 resulting in a device second front surface 85. Accordingly, the CMP method of the present inventions begins by first planarizing the device front surface 75 with a first medium (not shown), to be described in detail below, to expose a device second front surface 85. From FIG. 3, it is clear that the surface of the device second front surface 85 has been planarized when compared to the uneven surface of the device front surface 75 of FIG. 2. However, the resulting device second front surface 85 contains several problems. First, the removal and planarization of the second metal layer 70 has left metallic contaminants 95 on the device second front surface 85. These metallic contaminants 95 typically include tungsten, copper, iron, aluminum, sodium, potassium, lithium, chromium, zinc and similar metals that are introduced by the first planarizing step. Secondly, the removal and planarization of the second metal layer 70 has left an uneven topography immediately above the via 60 known as "dishing" 90. Dishing 90 occurs because the first planarizing step is selective to the second metal layer 70 and therefore removes some of the second metal layer 70 in the via 60 to cause the dishing 90. These two problems necessitate a second planarization step, known as a "touch up" or "buffing" step, to remove the metallic contaminants 95 and planarize the dishing 90. The CMP method of the present invention, as detailed below, performs this buffing or touch-up step by planarizing the device second front surface 85 with a second medium (not shown), to be described in detail below, resulting in the planarized semiconductor device of FIG. 4. An in-between step of rinsing the back surface 6 (FIG. 1) of the semiconductor device 5 after planarizing the device front surface 75, but before planarizing the device second front surface 85, is further described in detail below.

Figure 4:
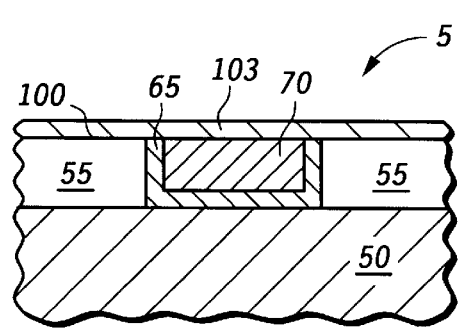
FIG. 4 is a cross-sectional view of the semiconductor device after a second planarizing step of the CMP method of the present invention.

FIG. 4 illustrates a planarized semiconductor device 5 after applying the second planarizing step of the CMP method of the present invention. A resulting third front surface 100 that is completely planarized is shown, with the metallic contaminants 95 and the dishing 90 depicted in FIG. 3 removed. A passivation layer 103 to protect the semiconductor device 5 is then deposited above the resulting third front surface 100. The passivation layer 103 typically is silicon dioxide or silicon nitride. The actual CMP method used to achieve the semiconductor device 5 of FIG. 4 from FIG. 1 will now be described in detail.

FIG. 5 is a top view of an embodiment utilizing the CMP method of the present invention. The embodiment of FIG. 5 illustrates a manufacturing process using the CMP method of the present invention. The semiconductor device 5 of FIGS. 1–4, to which the CMP method of the present invention is applied, is located on the wafer front surface 205 (FIG. 6) of a semiconductor wafer 191 attached below carrier 125. While the manufacturing process of FIG. 5 will be described with regard to the processing of the semiconductor wafer 191, it is understood by one skilled in the art that the wafer front surface 205 of the semiconductor wafer 191 contains numerous semiconductor devices 5 of FIGS. 1–4. Accordingly, the application of the CMP method of the present invention to the semiconductor wafer 191 applies to the semiconductor device 5 of FIGS. 1–4.

In FIG. 5, two planarizing stations are shown—a first planarizing station 115 and a second planarizing station 120. The first planarizing station 115 has a first platen 130. The first platen 130 rotates in a first platen rotation direction 135 and has a first abrasive pad 195 on the first platen 130 surface that also rotates with the first platen 130 in the platen rotation direction 135. Above the first platen 130 and the first abrasive pad 195 are two dispensers—a first slurry dispenser 140 and a first water dispenser 145. The first water dispenser 145 sprays water, typically deionized water, at the first platen 130 when activated, while the first slurry dispenser 140 sprays a first slurry 150 at the first platen 130 holding the first abrasive pad 195 when activated. The first slurry dispenser 140 dispenses the first slurry 150 which is used to planarize the device front surface 75 (FIG. 1) of the semiconductor wafer 191. Furthermore, the first water dispenser 145 is used to remove the first slurry 150 from the first platen 130 and the device front surface 75 (FIG. 1) of the semiconductor wafer 191. Consequently, the first slurry dispenser 140 and the first water dispenser 145 are typically not activated at the same time.

The first slurry 150 is termed a first medium since the first slurry 150 is composed of two components—a first abrasive component (not shown) and a first chemical solution (not shown). The first abrasive component includes abrasive particles such as alumina, silica, sand or other such particles that are capable of wearing, grinding or rubbing away other elements by friction, including an abrasive pad. The first chemical solution is typically determined by the pH measure of acidity and alkalinity of a solution. The chemical solution of the first slurry 150 typically has a first pH less than 7.0 to effectively make the chemical solution of the first slurry 150 acidic. Specifically, the first chemical solution of the first slurry 150 is composed of an oxidizing agent, water and an acidic compound such as ferric nitrate and nitric acid. Other acidic compounds may include sulfuric acid, phosphoric acid and acetic acid.

It is important to note that the chemical composition of the first chemical solution is not as important as the effect of mixing the first chemical solution with the second chemical solution (not shown) in the second slurry 155 of the second planarizing station 120. As will be discussed in more detail below, a second medium will be sprayed, the second medium containing a second chemical solution a second abrasive component, at the wafer front surface 205 of the semiconductor wafer 191. While the semiconductor wafer 191 will be subjected to a water rinse at a rinse station 127 to remove the first slurry 150 from the device front surface 75, some of the first slurry 150 may remain on the device back surface 6 of the semiconductor wafer 191. The mixing of the first chemical solution and the second chemical solution left on the device back surface may form a precipitate upon mixing. It is the precipitate effect of this mixing that causes contamination of the semiconductor device. Accordingly, while specific compositions for the first and second chemical solutions are provided herein, the CMP method of the present invention applies to other such combinations of solutions should the mixing of such solutions form a precipitate that must be prevented utilizing the CMP method of the present invention.

Further embodiments provide for the first pH of the first slurry 150 to be greater than about 7.0 while the second pH of the second slurry 155 is less than 7.0. With such a composition, the first slurry 150, in this embodiment, would be a basic slurry with a typical composition of water and a basic compound such as ammonium hydroxide or potassium hydroxide. The second slurry 155, in this embodiment, would be an acidic slurry with a typical composition of an oxidizing agent, water and an acidic compound such as ferric nitrate and nitric acid. Other acidic compounds may include sulfuric acid, phosphoric acid and acetic acid.

The second planarizing station 120 has a second slurry dispenser 160 and a second water dispenser 165. Like the first planarizing station 115, a second platen 128 rotating in a second platen rotation direction 175 is provided in the second planarizing station 120. Further, the carrier 125 will also be repositioned above the second planarizing station 120 and rotated in a carrier rotation direction 126. Each of these components has similar functions as its counterpart in the first planarizing station 115. As such, above the second platen 128 and the second abrasive pad 196 (FIG. 6) are two dispensers—a second slurry dispenser 160 and a second water dispenser 165. The second water dispenser 165 sprays water, typically deionized water, at the second platen 128 when activated, while the second slurry dispenser 160 sprays a second slurry 155 at the second platen 128 holding the second abrasive pad 196 when activated. The second slurry dispenser 160 dispenses the second slurry 155 which is used to planarize the device front surface 75 (FIG. 1) of the semiconductor wafer 191. The second water dispenser 165 is used to remove the second slurry 155 from the second platen 128 and the device front surface 75 (FIG. 1) of the semiconductor wafer 191. Consequently, the second slurry dispenser 160 and the second water dispenser 165 are typically not activated at the same time.

The second slurry 155 is termed a second medium since the second slurry 155 is composed of two components—a second abrasive component (not shown) and a second chemical solution (not shown). The second abrasive component includes abrasive particles such as alumina, silica, sand or other such particles that are capable of wearing, grinding or rubbing away other elements by friction. The second chemical solution is typically determined by the pH measure of acidity and alkalinity of a solution. The chemical solution of the second slurry 155 typically has a second pH greater than 7.0 to effectively make the chemical solution of the second slurry 155 basic. Specifically, the second chemical solution of the second slurry 155 is composed of water and a basic compound such as ammonium hydroxide or potassium hydroxide.

As was the case with the first slurry 150, the importance of the chemical composition of the second slurry 155 is of less importance to the present invention than the effect of any precipitate resulting from the mixing the first and second slurries. Accordingly, for the same reasons as discussed above with regard to the first slurry, it is understood that first and second slurries of varying compositions may be used in the present embodiment, yet the CMP method of the present invention, as claimed below, would apply should such mixing result in forming a contaminant precipitate.

Separate from the first and second planarizing stations are a loading station 180 and an unloading station 185. The loading station 180 uses a shuttle (not shown) to remove the semiconductor wafer 191 from a cartridge (not shown) in the loading station 180 and allows the carrier 125 to lift the semiconductor wafer 191 from the shuttle by a vacuum 210 (FIG. 6) so that the wafer may be subjected to the CMP method of the present invention. On the other end, the unloading station 185 receives the planarized semiconductor wafer 191 after the wafer is put into a trough (not shown) then into a cartridge (not shown) and then in the unloading station 185. Also separate from the first and second planarizing stations is a rinse station 127 used to rinse the device front surface 75 after the semiconductor wafer has been subjected to the first planarizing step and the rinsing step of the back surface of the wafer using the first water dispenser 145. The rinse at the rinse station 127 also occurs before the second planarizing step at the second planarizing station 120. The embodiment of FIG. 5 uses a polishing arm 116 to position the wafer 191 from the shuttle taking the wafer from the loading station 180 onto the carrier 125, to the first planarizing station 115 to the rinse station 127, to the second planarizing station 120 and to the shuttle (not shown) to unload at the unloading station 185. The movement of the polishing arm 116 is shown by the dashed lines of FIG. 5.

FIG. 6 is a side view of an embodiment implementing the CMP method of the present invention. Since both the first and second planarizing stations have essentially the same side view, FIG. 6, which depicts one of either of such stations, will incorporate the reference numbers for the similar elements in both the first and second planarizing stations. A first abrasive pad 195 /second abrasive pad 196 overlies the first platen 130/second platen 128, with a first slurry dispenser 140/second slurry dispenser 160 overlying the platen and pad. The carrier 125 holds the semiconductor wafer 191 with a vacuum 210. The vacuum pulls air away from the wafer back surface 200 so that the wafer 191 is pressed against the carrier 125. Accordingly, the vacuum is used to hold the semiconductor wafer 191 within the carrier 125 while positioning the wafer between planarizing and rinse stations. A processing arm 116 holds the carrier 125. The semiconductor wafer has a wafer front surface 205 and a wafer back surface 200. It is understood, as discussed above, that the wafer front surface 205 is a mechanism for holding the semiconductor device 5 of FIGS. 1–4, and therefore, the wafer front surface 205 is analogous to the device front surface 75 of FIGS. 1–4 that undergoes the CMP method of the present invention. Likewise, the wafer back surface 200 is also analogous to the device back surface 6 of FIG. 1. The wafer 191 will be lowered in a lowering direction 215 to contact the first abrasive pad 195/second abrasive pad 196 so that the wafer front surface 205 may be planarized.

In use, the CMP method of the present invention begins at position A of FIG. 5 to remove the wafer 191 from the loading station 180 by using a shuttle (not shown) to move the wafer 191 to position B so that the processing arm 116 may reposition the wafer 191. At position B, the carrier 125 on the processing arm 116 lifts the wafer 191 off of the shuttle (not shown) using a vacuum 210 (FIG. 6) to hold the wafer 191 in the carrier 125 until the processing arm reaches position C. At position C, the processing arm 116 lowers the carrier 125 and wafer 191 (FIG. 6) above the first platen 130. The first platen 130 is rotated in a first platen rotation direction 135. Prior to lowering the wafer 191 onto the first abrasive pad 195, the first slurry dispenser 140 is activated to dispense the first slurry 150 onto the first platen 130. The wafer 191 is then lowered onto the rotating first platen 130. As the wafer contacts the rotating first platen 130, the vacuum 210 in the carrier 125 is disengaged and the carrier 125 is rotated in a carrier rotation direction 126. The wafer is maintained in the carrier through frictional forces between the wafer 191 and the carrier 125. The rotating wafer and first platen planarize the wafer front surface 205 to remove the second metal layer 70 (FIG. 2). After the second metal layer 70 has been planarized, the first slurry dispenser is deactivated and the first water dispenser 145 is activated to spray deionized water over the first platen 130 and the wafer 191 to remove the first slurry 150 from the wafer 191.

This step is done before the vacuum 210 is activated so that the deionized water may reach the wafer back surface 200 where some of the first slurry 150 may be trapped. The back surface 200 (analogous to the device back surface 6 of the semiconductor device 5 of FIGS. 1–4) is thereby cleaned of the first slurry 150 and the first slurry 150 does not remain trapped since the vacuum 210 was not activated when the deionized water was sprayed. The cleaning of the back surface 200 of the first slurry 150 ensures that no first slurry 150 will remain on the back surface 200 of the wafer 191 when the wafer 191 is subjected to a second planarizing step at the second planarizing station 120 with a second slurry 155. Consequently, there will be no mixing of the first slurry 150 from the back surface 200 of the wafer 191 with the second slurry 155 and contamination may be prevented.

After the deionized water spray by the first water dispenser 145, the vacuum 210 is activated and the wafer 191 is raised in the carrier 125 by the processing arm 116 to position D at a rinse station 127 where the front surface 205 of the wafer 191 is cleaned of the first slurry 150. After this step, both sides of the wafer have been cleaned of the first slurry 150 prior to subjecting the wafer 191 to a second slurry 155. It is important to note that the cleansing at the rinse station 127 does not remove the first slurry 150 trapped on the back surface 200 of the wafer 191 since the vacuum 210 is activated during the rinsing of the front surface 205 and therefore any first slurry 150 remaining trapped on the back surface 200 will not be removed by the rinsing at the rinse station 127. Accordingly, the rinsing step by the first water dispenser 145 while the vacuum 210 is deactivated is important since this rinsing step allows the deionized water to cleanse the back surface 200 of the wafer 191 and thereby prevent particle contamination that may occur by the later mixing of the first slurry 150 and the second slurry 155.

After the deionized water spraying of the front surface 205 of the wafer at position D, the polishing arm 116 repositions the wafer 191 to position E where the wafer is subjected to a second planarizing step known as a "touch up" or "buff" planarization step. The second planarizing step takes place at the second planarizing station 120 and is performed using the same planarizing method described above on the first planarizing station 115. Specifically, at position E, the processing arm 116 lowers the carrier 125 and wafer 191 (FIG. 6) above the second platen 128. The second platen 128 is rotated in a second platen rotation direction 175. Prior to lowering the wafer 191 onto the second abrasive pad 196, the second slurry dispenser 160 is activated to dispense the second slurry 155 onto the second platen 128. The wafer 191 is then lowered onto the rotating second platen 128. As the wafer contacts the rotating second platen 128, the vacuum 210 in the carrier 125 is disengaged and the carrier 125 is rotated in a carrier rotation direction 126. The wafer is maintained in the carrier through frictional forces between the wafer 191 and the carrier 125. The rotating wafer and second platen 128 planarize the wafer front surface 205 to remove the metallic contaminants 85 (FIG. 3) and remove the dishing 90 (FIG. 3) caused by the first planarizing step at the first planarizing station 115. After wafer 191 has been touched up to remove the metallic contaminants 85 and the dishing 90, the second slurry dispenser 160 is deactivated and the second water dispenser 165 is activated to spray deionized water over the second platen 128 and the wafer 191 to remove the second slurry 155 from the wafer 191. After the second slurry has been removed, the vacuum 210 is activated and the polishing arm 116 repositions the wafer 191 to position F where the wafer 191 is placed into a trough (not shown). Once in the trough, the wafer 191 is moved to a cartridge (not shown) in the unloading station 185.

In summary, as shown in the flow chart of FIG. 7, the CMP method of the present invention comprises the steps of:

first planarizing the device front surface with a first slurry (220);

rinsing the device back surface with water(225); and second planarizing the device second front surface with a second slurry (230).

This method is performed at a low cost and is ecologically safe with insignificant environmental impact. More importantly, the CMP method of the present invention reduces overall device defectivity by preventing particle generation as shown in FIG. 8.

FIG. 8 is a graph 234 illustrating that wafers contain lower particle contaminants when the CMP method of the present invention is used. In FIG. 8, data representing the defect counts per wafer, i.e. the number of particle contaminants on a wafer, is illustrated in graph format to compare the number of defect counts generated when the CMP method of the present invention is used as compared to when the CMP method is not used. A baseline defect count line 235 represents the number of particle contaminants generated on a wafer not using the CMP method of the present invention while a newline defect count line 240 represents the number of particle contaminants generated on a wafer using the CMP method of the present invention. It is clear from the graph 234 that using the CMP method of the present invention lowers the defect counts by about two orders of magnitude (from a defect count greater than about 25,000 to a defect count in the hundreds) as measured using Tencor's Advanced Inspection Technology Tool.

The method of the present invention has been described in connection with the preferred embodiments as disclosed herein. Although an embodiment of the present invention has been shown and described in detail, along with variances thereof, many other varied embodiments that incorporate the teachings of the invention may be easily constructed by those skilled in the art that may fall within the scope of the present invention as claimed below.

We claim:

1. A method of chemical mechanical planarization of a semiconductor device comprising:

forming a first layer over a semiconductor device having a device front surface and a device back surface, said device front surface being a top surface of said first layer;

first planarizing said device front surface with a first medium to expose a device second front surface, said first medium comprising a first abrasive component and a first chemical solution, wherein a first portion of said first layer is removed during said first planarizing;

rinsing said device back surface with water after said first planarizing; and second planarizing said device second front surface with a second medium, wherein:
  said second medium comprising a second abrasive component and a second chemical solution;
  a second portion of said first layer is removed during said second planarizing; and
  the second planarizing is performed after rinsing.

2. The method of claim 1, wherein said first layer includes a metal layer.

3. The method of claim 2, wherein said first planarizing said device front surface further comprises:

engaging said semiconductor device in a carrier, said semiconductor device is engaged in said carrier through a vacuum means so that said device back surface of said semiconductor device faces said carrier;

spraying said first slurry onto a first abrasive pad, said first abrasive pad overlying a first platen on a first planarizing station;

positioning said semiconductor device onto said first planarizing station by disengaging said vacuum means to allow said semiconductor device to contact said first abrasive pad overlying said first platen such that said device front surface of said semiconductor device contacts said first abrasive pad; and rotating said carrier and said first platen with respect to the other such that said device front surface in said carrier contacts said first abrasive pad rotating on said first platen to planarize said device front surface.

4. The method of claim 3, wherein said rinsing said device back surface of said semiconductor device further comprises rinsing said device back surface with water that flows between said device back surface of said semiconductor device and said carrier on said first planarizing station while said vacuum means is disengaged.

5. The method of claim 2, wherein said second planarizing said device second front surface further comprises:

engaging said semiconductor device in a carrier, said semiconductor device is engaged in said carrier through a vacuum means so that said device back surface of said semiconductor device faces said carrier;

spraying said second slurry onto a second abrasive pad, said second abrasive pad overlying a second platen on a second planarizing station;

positioning said semiconductor device onto said second planarizing station by disengaging said vacuum means to allow said semiconductor device to contact said second abrasive pad overlying said second platen such that said device second front surface of said semiconductor device contacts said second abrasive pad; and rotating said carrier and said second platen with respect to the other such that said device second front surface in said carrier contacts said second abrasive pad rotating on said second platen to planarize said device second front surface.

6. The method of claim 1, wherein said water comprises deionized water.

7. The method of claim 1, wherein said first layer comprises a material from the group consisting of tungsten, copper, aluminum, platinum, iridium, and alloys thereof.

8. The method of claim 1, further comprising rinsing said device front surface at a rinse station after said first planarizing and before said second planarizing.

9. The method of claim 1, wherein said first and second chemical solutions form a precipitate upon mixing.

10. The method of claim 1, wherein said first chemical solution has a first pH and said second chemical solution has a second pH, said first pH being different than said second pH.

11. The method of claim 10, wherein said first pH is less than about 7.0, and said second pH is greater than about 7.0.

12. The method of claim 11, wherein said first chemical solution comprises an oxidizing agent, water and an acidic compound.

13. The method of claim 12, wherein said acidic compound comprises a compound from the group consisting of ferric nitrate, nitric acid, sulfuric acid, phosphoric acid and acetic acid.

14. The method of claim 11, wherein said second chemical solution comprises water and a basic compound.

15. The method of claim 14, wherein said basic compound comprises a compound from the group consisting of ammonium hydroxide and potassium hydroxide.

16. The method of claim 10, wherein said first pH is greater than about 7.0, and said second pH is less than about 7.0.

17. The method of claim 16, wherein said first chemical solution comprises water and a basic compound.

18. The method of claim 17, wherein said basic compound comprises a compound from the group consisting of ammonium hydroxide and potassium hydroxide.

19. The method of claim 16, wherein said second chemical solution comprises an oxidizing agent, water and an acidic compound.

20. The method of claim 19, wherein said acidic compound comprises a compound from the group consisting of ferric nitrate, nitric acid, sulfuric acid, phosphoric acid and acetic acid.

21. The method of claim 1, wherein said first and second abrasive components comprise abrasive particles selected from the group consisting of alumina and silica.

22. The method of claim 1, further comprising a step of forming a second layer over the first layer, wherein the second layer is an earliest layer formed over the first layer and is formed after the second planarizing.

23. A method of forming a semiconductor device comprising:

(i) forming a semiconductor structure comprising:
  forming an active device on a substrate;
  depositing a first metal layer overlying said active device;
  depositing a dielectric layer overlying said first metal layer;
  forming a via in said dielectric layer down to said first metal layer;
  forming a barrier/glue layer over said dielectric layer and said via; and
  forming a second metal layer over said dielectric layer and said via, wherein said second metal layer defines a device front surface of said semiconductor structure and said substrate defines a device back surface of said semiconductor device;

(ii) first planarizing said device front surface with a first medium to expose a device second front surface, said first medium comprising a first abrasive component and a first chemical solution;

(iii) rinsing said device back surface and said device front surface with water after said first planarizing;

(iv) second planarizing said device second front surface with a second medium to expose a device third front surface, said second medium comprising a second abrasive component and a second chemical solution wherein said second planarizing is performed after said rinsing; and (v) depositing a passivation layer on said device third front surface to form said semiconductor device.

24. The method of claim 23, wherein said first planarizing said device front surface removes a first portion of said second metal layer and said barrier/glue layer not within said via; and said second planarizing removes a second portion of said second metal layer and said barrier/glue layer.

25. The method of claim 23, wherein said second metal layer comprises tungsten and said barrier/glue layer comprises titanium nitride.

26. The method of claim 23, wherein said passivation layer comprises silicon dioxide or silicon nitride.

27. The method of claim 23, wherein the passivation layer is a first layer formed over the second metal layer and is formed after the second planarizing.

* * * * *